(12) United States Patent
Kim et al.

(10) Patent No.: US 10,804,218 B2
(45) Date of Patent: Oct. 13, 2020

(54) SEMICONDUCTOR PACKAGE

(71) Applicant: SAMSUNG ELECTRONICS CO., LTD., Suwon-si, Gyeonggi-do (KR)

(72) Inventors: Young-Lyong Kim, Anyang-si (KR); Seung-Duk Baek, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 28 days.

(21) Appl. No.: 16/110,674

(22) Filed: Aug. 23, 2018

(65) Prior Publication Data
US 2019/0229071 A1  Jul. 25, 2019

(30) Foreign Application Priority Data
Jan. 23, 2018  (KR) .................. 10-2018-0008406

(51) Int. Cl.
*H01L 23/00* (2006.01)
*H01L 25/065* (2006.01)
(Continued)

(52) U.S. Cl.
CPC .......... *H01L 23/562* (2013.01); *H01L 21/561* (2013.01); *H01L 21/563* (2013.01); *H01L 21/568* (2013.01); *H01L 23/3135* (2013.01); *H01L 23/3171* (2013.01); *H01L 23/3192* (2013.01); *H01L 24/13* (2013.01); *H01L 25/0652* (2013.01); *H01L 25/0657* (2013.01); *H01L 25/50* (2013.01); *H01L 23/3128* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 25/18* (2013.01); *H01L 2224/1312* (2013.01); *H01L 2224/13025* (2013.01); *H01L 2224/13026* (2013.01); *H01L 2224/13082* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13144* (2013.01); *H01L 2224/13147* (2013.01); *H01L 2224/13155* (2013.01);
(Continued)

(58) Field of Classification Search
CPC ....... H01L 25/0657; H01L 2225/16513; H01L 23/3171; H01L 23/3192
See application file for complete search history.

(56) References Cited

U.S. PATENT DOCUMENTS 8,785,974 B2  7/2014  Lidow et al.
8,981,532 B2  3/2015  Torii
(Continued)

*Primary Examiner* — John A Bodnar
(74) *Attorney, Agent, or Firm* — F. Chau & Associates, LLC

(57) ABSTRACT

A semiconductor package includes a semiconductor chip that includes a first region and a second region spaced apart from the first region; a plurality of connection bumps disposed under the first region of the semiconductor chip; and a protection layer that covers a bottom surface of the semiconductor chip in the second region, wherein the protection layer does not cover the bottom surface of the semiconductor chip in the first region and is not disposed between the plurality of connection bumps. The semiconductor chip of the semiconductor package is protected by the protection layer.

15 Claims, 16 Drawing Sheets

(51) Int. Cl.
*H01L 25/00* (2006.01)
*H01L 23/31* (2006.01)
*H01L 21/56* (2006.01)
*H01L 25/18* (2006.01)

(52) U.S. Cl.
CPC .......... *H01L 2224/13164* (2013.01); *H01L 2224/13169* (2013.01); *H01L 2224/1413* (2013.01); *H01L 2224/2919* (2013.01); *H01L 2224/2929* (2013.01); *H01L 2224/29339* (2013.01); *H01L 2224/29344* (2013.01); *H01L 2224/29347* (2013.01); *H01L 2224/29355* (2013.01); *H01L 2224/73204* (2013.01); *H01L 2224/81801* (2013.01); *H01L 2224/8388* (2013.01); *H01L 2224/83862* (2013.01); *H01L 2224/83874* (2013.01); *H01L 2225/06513* (2013.01); *H01L 2225/06517* (2013.01); *H01L 2225/06541* (2013.01); *H01L 2225/06555* (2013.01); *H01L 2225/06582* (2013.01); *H01L 2924/10252* (2013.01); *H01L 2924/10253* (2013.01); *H01L 2924/10329* (2013.01); *H01L 2924/10333* (2013.01); *H01L 2924/10335* (2013.01); *H01L 2924/181* (2013.01); *H01L 2924/18161* (2013.01)

(56) References Cited

U.S. PATENT DOCUMENTS

| | | |
|---|---|---|
| 9,054,100 B2 | 6/2015 | Lee et al. |
| 9,372,206 B2 | 6/2016 | Wu et al. |
| 2002/0033412 A1* | 3/2002 | Tung ...................... H01L 24/11 228/215 |
| 2003/0141582 A1* | 7/2003 | Yang ..................... H01L 21/563 257/686 |
| 2006/0134875 A1 | 6/2006 | Ahn et al. |
| 2007/0045841 A1 | 3/2007 | Cho et al. |
| 2012/0007228 A1* | 1/2012 | Lu ........................... H01L 24/13 257/692 |
| 2012/0068353 A1* | 3/2012 | Huang ................... H01L 21/561 257/774 |
| 2012/0170237 A1* | 7/2012 | Canegallo ............... H01L 23/48 361/767 |
| 2013/0113118 A1 | 5/2013 | Kim et al. |
| 2013/0256878 A1* | 10/2013 | Hsu ................... H01L 23/49811 257/737 |
| 2015/0132367 A1 | 5/2015 | Rueter et al. |
| 2015/0348930 A1* | 12/2015 | Jeong ..................... H01L 24/17 257/737 |

\* cited by examiner

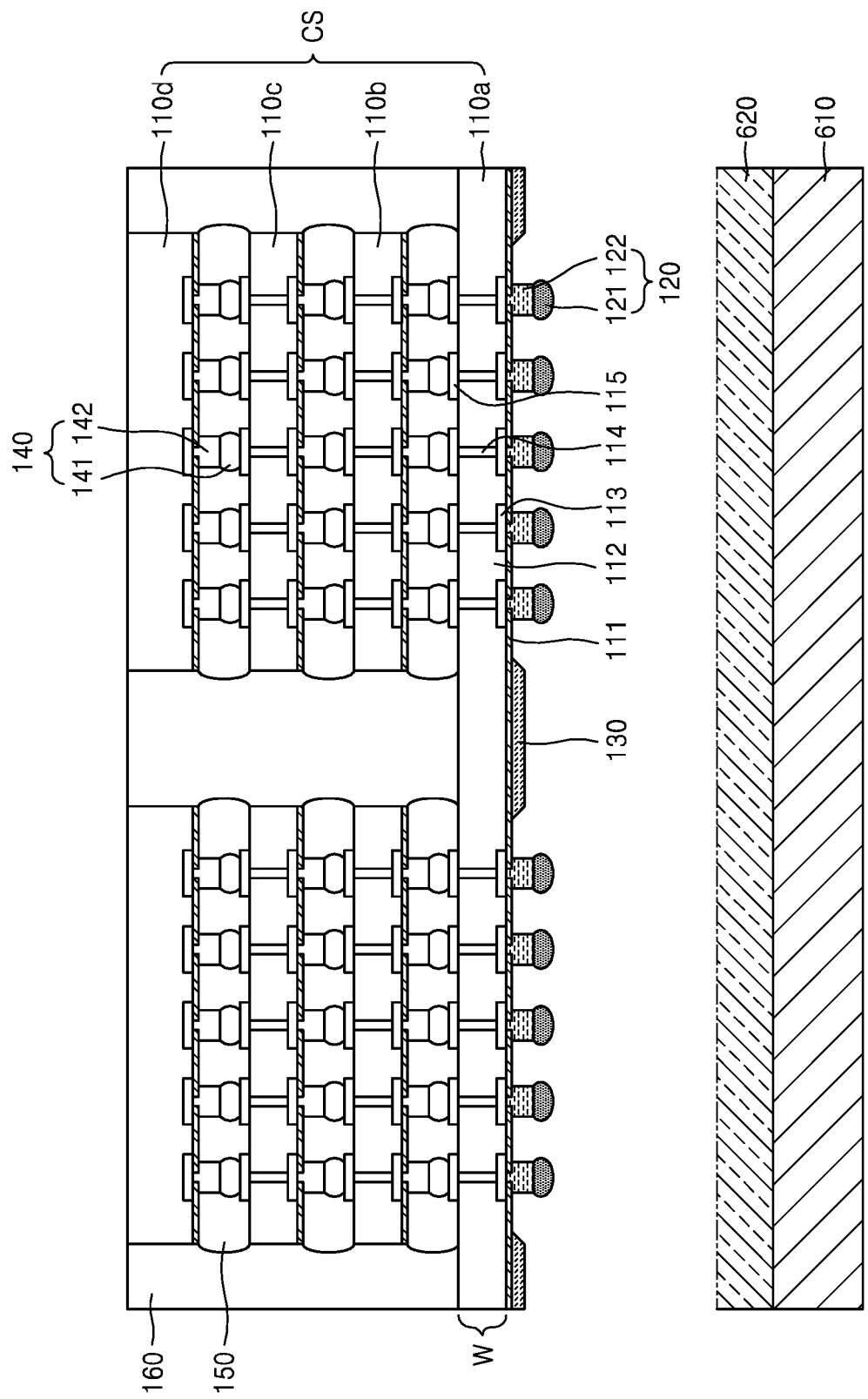

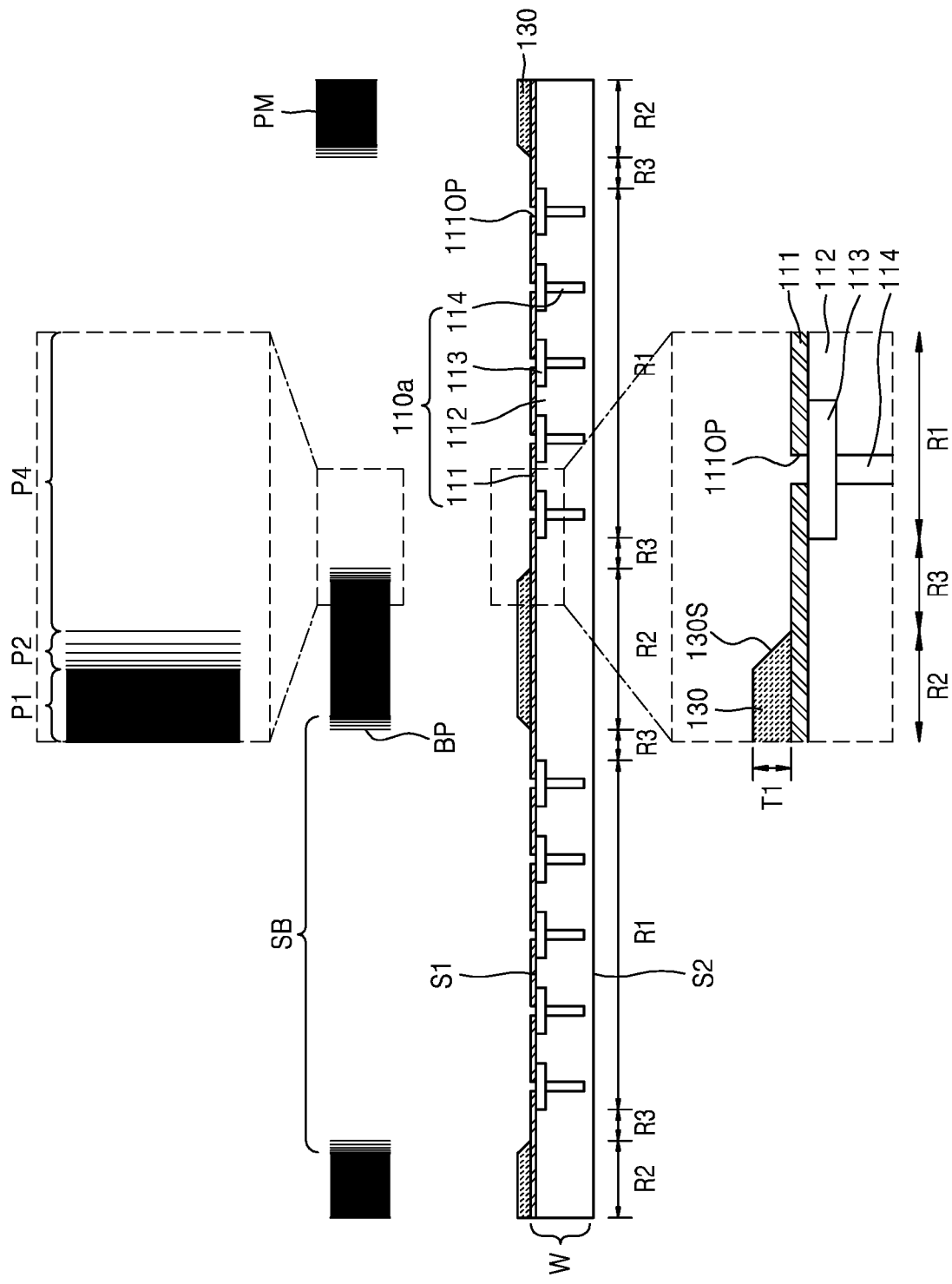

SEMICONDUCTOR PACKAGE

CROSS-REFERENCE TO RELATED APPLICATION

This application claims priority under 35 U.S.C. § 119 from, and the benefit of, Korean Patent Application No. 10-2018-0008406, filed on Jan. 23, 2018 in the Korean Intellectual Property Office, the contents of which are herein incorporated by reference in their entirety.

BACKGROUND

Embodiments of the inventive concept are directed to a semiconductor package, and more particularly, to a semiconductor package that includes connecting bumps.

As electronic products have become more miniaturized, multifunctional, and have higher performance, there is a demand for semiconductor packages that are thinner, more highly integrated, and faster. Accordingly, instead of a conventional method of connecting a semiconductor chip to a substrate by using a wire, a method of connecting a semiconductor chip to a substrate by using a connection bump attached to a bottom surface of the semiconductor chip has been developed. On the other hand, as semiconductor packages become thinner and smaller, a semiconductor chip is likely to be damaged by external physical impact or scratches.

SUMMARY

Embodiments of the inventive concept can provide a semiconductor package that can prevent damage to a semiconductor chip.

According to an embodiment of the inventive concept, there is provided a semiconductor package, including: a semiconductor chip that includes a first region and a second region spaced apart from the first region; a plurality of connection bumps disposed under the first region of the semiconductor chip; and a protection layer that covers a bottom surface of the semiconductor chip in the second region, wherein the protection layer does not cover the bottom surface of the semiconductor chip in the first region and is not disposed between the plurality of connection bumps.

According to another embodiment of the inventive concept, there is provided a semiconductor package, including: a semiconductor chip stack that includes a plurality of semiconductor chips stacked in a vertical direction; a connection bump disposed under a center portion of a lowermost semiconductor chip of the plurality of semiconductor chips, wherein the connection bump comprises a pillar that contacts the lowermost semiconductor chip and a cap that covers a bottom surface of the pillar; and a protection layer disposed under a edge portion of the lowermost semiconductor chip, wherein the protection layer is spaced apart from the connection bump in a horizontal direction.

According to another embodiment of the inventive concept, there is provided a semiconductor package, including: a package substrate; a first semiconductor chip mounted on the package substrate; a second semiconductor chip mounted on the first semiconductor chip; a plurality of connection bumps disposed under a bottom surface of a center portion of the first semiconductor chip that connect the first semiconductor chip to the package substrate; and a protection layer disposed under a bottom surface of an edge portion of the first semiconductor chip but not under the center portion of the first semiconductor chip.

BRIEF DESCRIPTION OF THE DRAWINGS

FIGS. 6A through 6I are cross-sectional views that illustrate a method of manufacturing a semiconductor package according to an embodiment;

FIGS. 7A and 7B are cross-sectional views that illustrate a method of manufacturing a semiconductor package according to an embodiment.

DETAILED DESCRIPTION OF EXEMPLARY EMBODIMENTS

Figure 1:
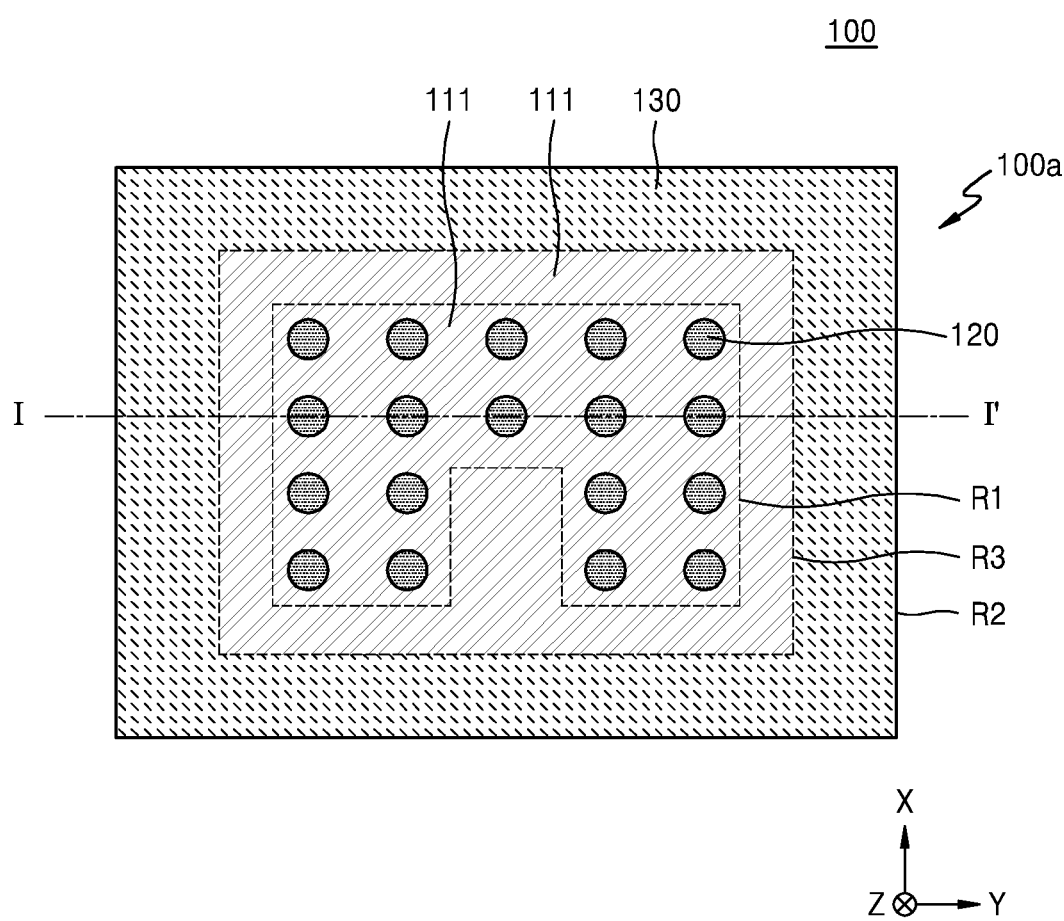
FIG. 1 illustrates a bottom surface of a semiconductor package according to an embodiment.
Figure 2:
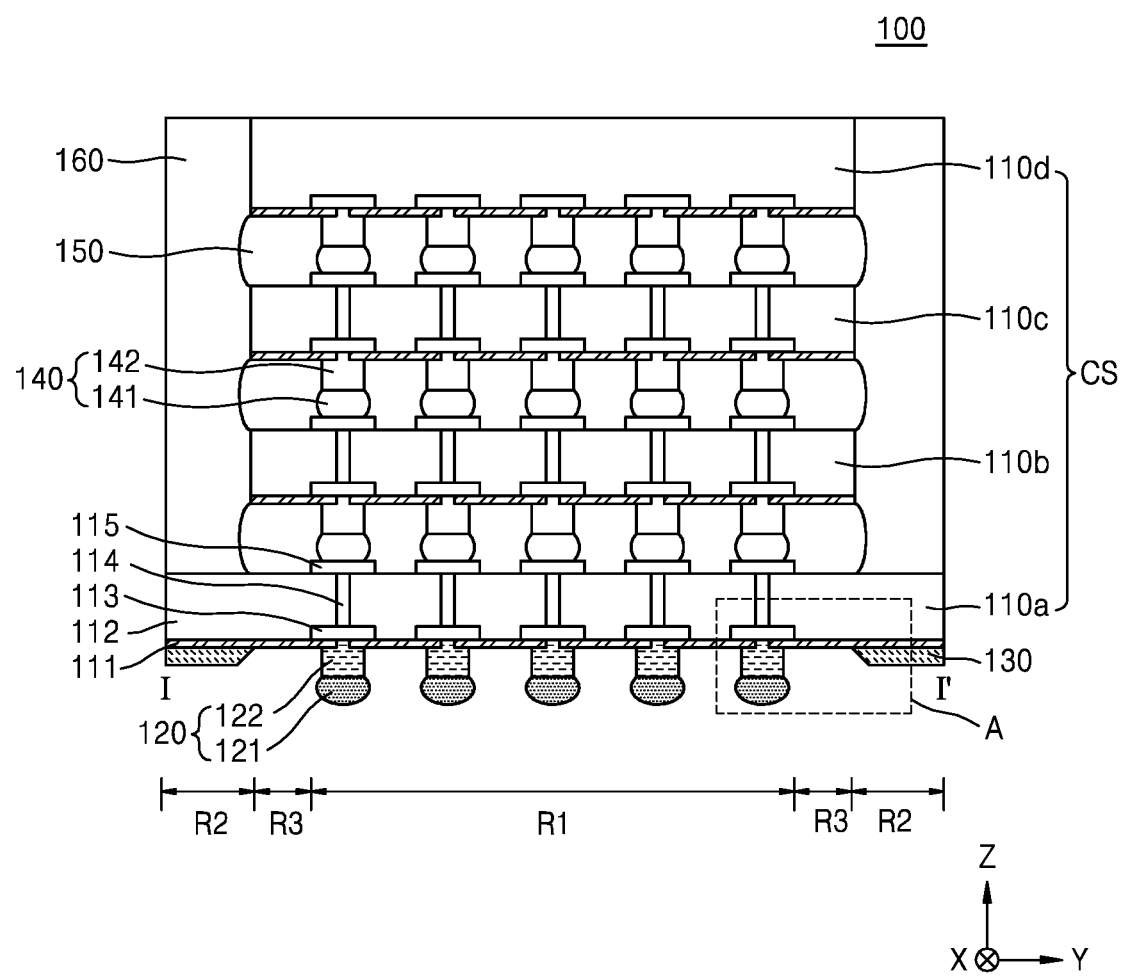
FIG. 2 is a cross-sectional view of a semiconductor package taken along the line I-I' in FIG. 1.
Figure 3:
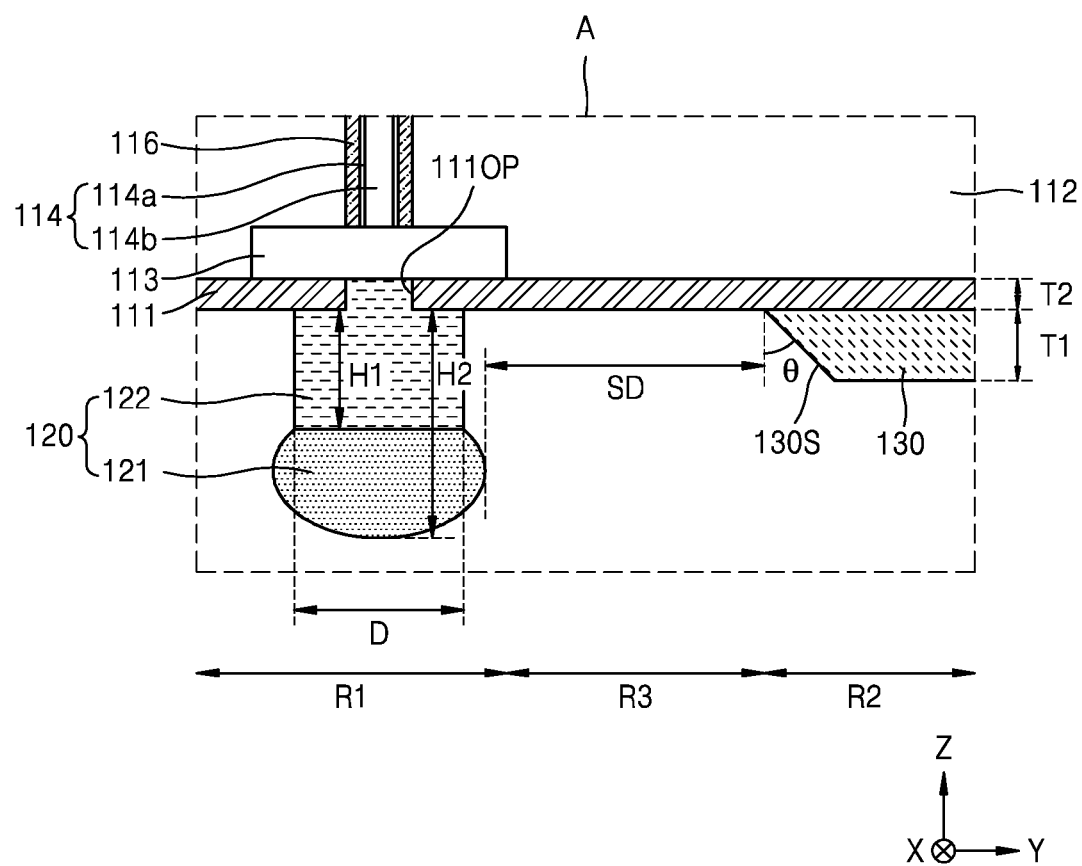
FIG. 3 is an enlarged view of a region A in FIG. 2.

FIG. 1 illustrates a bottom surface of a semiconductor package 100 according to an embodiment. FIG. 2 is a cross-sectional view of the semiconductor package 100 taken along the line I-I' in FIG. 1. FIG. 3 is an enlarged view of a region A in FIG. 2.

Referring to FIGS. 1 through 3, according to an embodiment, the semiconductor package 100 includes a plurality of semiconductor chips 110a through 110d. For example, the plurality of semiconductor chips 110a through 110d include a first semiconductor chip 110a, a second semiconductor chip 110b, a third semiconductor chip 110c, and a fourth semiconductor chip 110d. However, the number of semiconductor chips included in the semiconductor package 100 is not limited to four, and may include less or more semiconductor chips in other embodiments. The first through fourth semiconductor chips 110a through 110d are stacked in a vertical direction Z to form a semiconductor chip stack CS. In some embodiments, unlike as illustrated in FIG. 2, the semiconductor package 100 includes one or more semiconductor chip stacks CS. Herein, the first semiconductor chip 110a positioned at a bottom of the first through fourth semiconductor chips 110a through 110d that constitute the semiconductor chip stack CS are referred to as a lowermost semiconductor chip. In addition, in this specification, the second through fourth semiconductor chips 110b through 110d of the semiconductor chips that constitute the semiconductor chip stack CS are referred to as upper semiconductor chips.

According to an embodiment, each of the first through fourth semiconductor chips 110a through 110d may be a memory semiconductor chip or a logic semiconductor chip. A logic semiconductor chip may include, for example, a central processing unit (CPU), a graphics processing unit (GPU), a controller, an application specific integrated circuit (ASIC) processor, or an application processor (AP). A memory semiconductor chip may be, for example, dynamic random access memory (DRAM), static random access memory (SRAM), a flash memory, electrically erasable and programmable read-only memory (EEPROM), phase-change RAM (PRAM), magnetic random access memory (MRAM), or resistive random access memory (RRAM). Each of the first through fourth semiconductor chips 110a through 110d may not necessarily be a semiconductor chip of the same type. For example, the first semiconductor chip 110a may be a controller, and the second semiconductor chip 110b, the third semiconductor chip 110c, and the fourth semiconductor chip 110d may be DRAMs, but embodiments are not limited thereto.

According to an embodiment, a plurality of first connection bumps 140 are disposed between respective pairs of the first through fourth semiconductor chips 110a through 110d. For example, the first connection bump 140 may arranged between the first semiconductor chip 110a and the second semiconductor chip 110b, between the second semiconductor chip 110b and the third semiconductor chip 110c, and between the third semiconductor chip 110c and the fourth semiconductor chip 110d. The first through fourth semiconductor chips 110a through 110d are electrically connected to each other via the first connection bump 140. The first connection bump 140 is a micro-bump having a width of several micrometers to several hundreds of micrometers.

According to an embodiment, the first connection bumps 140 include a first pillar 142 and a first cap 141 that covers a bottom surface of the first pillar 142. For example, the first connection bump 140 between the first semiconductor chip 110a and the second semiconductor chip 110b includes a first pillar 142 in contact with a bottom pad 113 of the second semiconductor chip 110b and the first cap 141 in contact with a top pad 115 of the first semiconductor chip 110a. The first pillar 142 includes at least one of nickel (Ni), copper (Cu), palladium (Pd), platinum (Pt), or gold (Au). The first cap 141 includes, for example, tin (Sn), indium (In), bismuth (Bi), antimony (Sb), copper (Cu), silver (Ag), Au, zinc (Zn), or lead (Pb). In some embodiments, an intermediate layer is formed between the first cap 141 and the first pillar 142, or between the first cap 141 and the top pad 115. The intermediate layer includes an inter-metallic compound that is formed through a reaction between a metal in the first cap 141 and a metal in the first pillar 142, or between the metal in the first cap 141 and a metal in the top pad 115.

According to an embodiment, a chip bonding layer 150 is disposed between respective pairs of the first through fourth semiconductor chips 110a through 110d. For example, the chip bonding layer 150 is disposed between the first semiconductor chip 110a and the second semiconductor chip 110b, between the second semiconductor chip 110b and the third semiconductor chip 110c, and between the third semiconductor chip 110c and the fourth semiconductor chip 110d. The chip bonding layer 150 surrounds the first connection bumps 140 and fills a space between the first through fourth semiconductor chips 110a through 110d. The chip bonding layer 150 adheres the first through fourth semiconductor chips 110a through 110d to each other and protects the first connection bumps 140. The chip bonding layer 150 is formed by using a film or a paste-type adhesive. In some embodiments, the chip bonding layer 150 includes a non-conductive adhesive that includes a polymer resin. In other embodiments, the chip bonding layer 150 includes an anisotropic conductive adhesive or an isotropic conductive adhesive, each of which includes conductive particles and a polymer resin. The polymer resin of the chip bonding layer 150 includes, for example, a thermosetting resin, a thermoplastic resin, or an ultraviolet (UV) curable resin. The chip bonding layer 150 includes at least one of, for example, an epoxy resin, a urethane resin, or an acrylic resin. The conductive particles of the chip bonding layer 150 include at least one of, for example, Ni, Au, Ag, or Cu.

According to an embodiment, a chip sealant 160 is disposed on the top surface of the first semiconductor chip 110a and surrounds side surfaces of the second through fourth semiconductor chips 110b through 110d. The chip sealant 160 may include a thermosetting resin, a thermoplastic resin, a UV curable resin, etc. The chip sealant 160 may include an epoxy resin or a silicon resin. The chip sealant 160 may include, for example, an epoxy mold compound (EMC).

According to an embodiment, each of the first through fourth semiconductor chips 110a through 110d includes a body 112, the bottom pad 113, the top pad 115, a through via 114, and a passivation layer 111. However, the fourth semiconductor chip 110d at the uppermost portion of the semiconductor chip stack CS includes the body 112, the bottom pad 113, and the passivation layer 111, but not the through via 114 and the top pad 115.

According to an embodiment, the body 112 of each of the first through fourth semiconductor chips 110a through 110d includes a semiconductor substrate and an integrated circuit layer. The semiconductor substrate of the body 112 includes a Group IV semiconductor material such as silicon (Si) or germanium (Ge), or a III-V compound semiconductor material such as gallium arsenide (GaAs), indium arsenic (InAs), or indium phosphide (InP). The semiconductor substrate may be a single crystal wafer, a silicon on insulator (SOI) substrate, or an epitaxial layer. The integrated circuit layers of the body 112 are on bottom surfaces of the respective first through fourth semiconductor chips 110a through 110d. The bottom surface of each of the first through fourth semiconductor chips 110a through 110d can be referred to as an active surface. The top surface of each of the first through fourth semiconductor chips 110a through 110d that faces the active surface can be referred to as an inactive surface. The integrated circuit layer of the body 112 includes various types of discrete electronic components. For example, the integrated circuit layer includes active devices such as a field effect transistor (FET), or passive devices such as a capacitor or a resistor.

According to an embodiment, the bottom pad 113 and the top pad 115 are disposed on the bottom surface and the top surface of the body 112, respectively. The bottom pad 113 and the top pad 115 respectively include an electrically conductive material. For example, each of the bottom pad 113 and the top pad 115 includes at least one of Ni, Al, Cu, Au, Ag, Pt, or tungsten (W). FIGS. 1 through 3 show the bottom pad 113 as being embedded within the body 112, but in some embodiments, the bottom pad 113 protrudes from the bottom surface of the body 112. Likewise, the top pad 115 protrudes from the top surface of the body 112.

According to an embodiment, the through via 114 penetrates the body 112 of each of the first through third semiconductor chips 110a through 110c. One end of the through via 114 is connected to the top pad 115 and the other end of the through via 114 is connected to the bottom pad 113. The through via 114 includes a barrier layer 114a formed on a surface of a side wall of the through via 114 and a conductive portion 114b filling the inside of the through via 114. The barrier layer 114a of the through via 114 includes at least one of Ti, tantalum (Ta), titanium nitride (TiN), tantalum nitride (TaN), cobalt (Co), manganese (Mn), ruthenium (Ru), or tungsten nitride (WN). The conductive portion 114b of the through via 114 includes at least one of Cu, W, Ni, Ru, or Co. A via insulating layer 116 is interposed between the through via 114 and the body 112. The via insulating layer 116 includes at least one of, for example, an oxide layer, a nitride layer, a carbonized layer, or a polymer layer. Although the through via 114 is illustrated as being directly connected to the bottom pad 113 in FIGS. 2 and 3, the bottom pad 113 may be connected to the through via 114 via a wiring layer in the body 112.

According to an embodiment, a passivation layer 11 is disposed on the bottom surface of the body 112. The passivation layer 111 protects the bottom surface of the body 112. The passivation layer 111 includes, for example, an inorganic material such as an oxide or a nitride. For example, the passivation layer 111 includes at least one of silicon oxide or silicon nitride. A thickness of the passivation layer 111 is, for example, about 20 nm to about 2 nm.

According to an embodiment, the first semiconductor chip 110a includes a first region R1 and a second region R2 from a plan view. The first region R1 of the first semiconductor chip 110a is U-shaped. The first region R1 of the first semiconductor chip 110a is positioned at the center of the first semiconductor chip 10a and the second region R2 of the first semiconductor chip 110a is positioned on edges of the first semiconductor chip 110a. The second region R2 of the first semiconductor chip 110a surrounds the first region R1 of the first semiconductor chip 110a. In some embodiments, the first semiconductor chip 110a further includes a third region R3 positioned between the first region R1 and the second region R2. The third region R3 of the first semiconductor chip 110a surrounds the first region R1 of the first semiconductor chip 110a and the second region R2 of the first semiconductor chip 110a surrounds the third region R3 of the first semiconductor chip 110a.

According to an embodiment, a plurality of second connection bumps 120 are disposed under the first region R1 of the first semiconductor chip 110a. None of the second connection bumps 120 are disposed under the second region R2 and the third region R3 of the first semiconductor chip 110a. The second connection bump 120 electrically connects the first semiconductor chip 110a to an external substrate. In some embodiments, a structure or a size of the second connection bump 120 differs from those of the first connection bump 140. For example, a width of the second connection bump 120 can be greater than that of the first connection bump 140. A height H2 of the second connection bump 120 is, for example, about 20 μm to about 50 μm. Herein, the height H2 of the second connection bump 120 refers to a distance in the vertical direction Z from the bottom surface of the passivation layer 111 to the bottom end of the second connection bump 120.

According to an embodiment, the second connection bump 120 includes a second pillar 122 that contacts the bottom surface of the first semiconductor chip 110a and a second cap 121 that covers the bottom surface of the second pillar 122. The second pillar 122 contacts the bottom pad 113 of the first semiconductor chip 110a via an opening 111OP formed in the passivation layer 111. A height H1 of the second pillar 122 is about 10 μm to about 30 μm. Herein, the height H1 of the second pillar 122 refers to a distance in the vertical direction Z from the bottom surface of the passivation layer 111 to the bottom surface of the second pillar 122. A width D of the second pillar 122 in a horizontal direction Y is about 10 m to about 50 nm.

According to an embodiment, the second pillar 122 includes at least one of Ni, Cu, Pd, Pt, or Au. The second cap 121 includes, for example, Sn, In, Bi, Sb, Cu, Ag, Au, Zn, or Pb. In some embodiments, an intermediate layer is formed between the second cap 121 and the second pillar 122. The intermediate layer includes an inter-metallic compound formed by a reaction between a metal in the second cap 121 and a metal in the second pillar 122. In some embodiments, the second pillar 122 or the second cap 121 include different materials from the first pillar 142 or the first cap 141. In other embodiments, the second pillar 122 or the second cap 121 include the same materials as the first pillar 142 or the first cap 141.

According to an embodiment, a protection layer 130 is disposed under the bottom surface of the first semiconductor chip 110a and contacts the bottom surface of the first semiconductor chip 110a. The protection layer 130 covers the bottom surface of the first semiconductor chip 110a in the second region R2. In other words, a portion of the passivation layer 111 in the second region R2 of the first semiconductor chip 110a is covered by the protection layer 130. The protection layer 130 is not disposed under bottom surfaces of the second to fourth semiconductor chips 110b through 110d.

According to an embodiment, the protection layer 130 includes an organic material. The protection layer 130 includes a polymeric material such as, for example, polyimide. The protection layer 130 is formed, for example, from a photosensitive polyimide (PSPI). The protection layer 130 can reduce or prevent damage to the first semiconductor chip 110a due to scratches from particles. In particular, when the bottom surface of the first semiconductor chip 110a is exposed before the semiconductor package 100 is mounted on an external substrate, the protection layer 130 can prevent damage to the bottom surface of the first semiconductor chip 110a.

According to an embodiment, the protection layer 130 is sufficiently thick T1 to prevent damage to the first semiconductor chip 110a. However, since the second connection bump 120 and the external substrate need to contact with each other, the thickness T1 of the protection layer 130 is than the height H2 of the second connection bump 120. Further, the thickness T1 of the protection layer 130 is less than the height H1 of the second pillar 122. For example, the thickness T1 of the protection layer 130 is about 1 μm to about 10 μm.

According to an embodiment, the passivation layer 111 also protects the first semiconductor chip 110a, but protection of the first semiconductor chip 110a is further enhanced by partially covering the passivation layer ill with the protection layer 130. In some embodiments, a toughness of the protection layer 130 is greater than that of the passivation layer 111. In other words, the energy required to damage the protection layer 130 is greater than that required to damage the passivation layer 111. For example, the passivation layer 111 includes brittle silicon nitride and the protection layer 130 includes ductile polyimide. Thus, the protection layer 130 can more effectively protect the first semiconductor chip 110a from physical external impacts or scratches than the passivation layer 111.

According to an embodiment, the protection layer 130 does not cover the bottom surfaces of the first semiconductor chip 110a in the first region R1 and the third region R3. Accordingly, the passivation layer 111 is exposed on the bottom surfaces of the first semiconductor chip 110a in the first region R1 and the third region R3. Since no protection layer 130 is disposed in the first region R1 of the first semiconductor chip 110a, the protection layer 130 is not disposed between the second connection bumps 120. In addition, since no protection layer 130 is disposed in the third region R3 of the first semiconductor chip 110a, the protection layer 130 is spaced apart from the second connection bumps 120.

According to an embodiment, when the protection layer 130 covers the bottom surface of the first semiconductor chip 110a into the first region R1 or the third region R3, a portion of a carrier bonding layer (see FIG. 6E) used to fix the first semiconductor chip 110a to a carrier 610 (see FIG. 6E) cannot be removed from the narrow space between the protection layer 130 and the second connection bump 120, and can remain on the bottom surface of the first semiconductor chip 110a. On the other hand, when the protective layer 130 does not extend into the first region R1 of the first semiconductor chip 110a, where the second connection bumps 120 are disposed, a sufficient space is secured between the second connection bump 120 and the protection layer 130. Thus, a portion of the carrier bonding layer 620 (see FIG. 6E) that remains on the bottom surface of the first semiconductor chip 110a can be reduced or prevented.

According to an embodiment, a separation distance SD that is sufficiently long is provided between the second connection bump 120 and the protection layer 130 to secure a sufficient space between the second connection bumps 120 and the protection layer 130. On the other hand, when the separation distance SD between the second connection bumps 120 and the protection layer 130 is too long, an area of the passivation layer 111 not covered by the protection layer 130 but exposed to the outside increases, and thus, protection of the first semiconductor chip 110a is weakened. The separation distance SD in the horizontal direction Y from the second connection bump 120 closest to the second region R2 to the protection layer 130 is, for example, about 50 μm to about 100 μm.

In some embodiments, to secure a sufficient space between the second connection bumps 120 and the protection layer 130, the separation distance SD between the second connection bumps 120 and the protection layer 130 is greater than the height H1 of the second pillar 122. Further, the separation distance SD between the second connection bumps 120 and the protection layer 130 is greater than the height H2 of the second connection bump 120. In addition, to secure a sufficient space between the second connection bumps 120 and the protection layer 130, a sidewall 130S that faces the second connection bumps 120 of the protection layer 130 is inclined with respect to the vertical direction Z in the horizontal direction Y away from the second connection bumps 120. That is, an angle θ between the sidewall 130S of the protection layer 130 and the vertical direction Z is greater than 0 degrees and less than 90 degrees. For example, an angle θ between the side wall 130S of the protection layer 130 and the vertical direction Z is about 20° to about 80°.

According to an embodiment, the semiconductor package 100 is, for example, a high bandwidth memory (HBM) package, but embodiments are not limited thereto.

Figure 4:
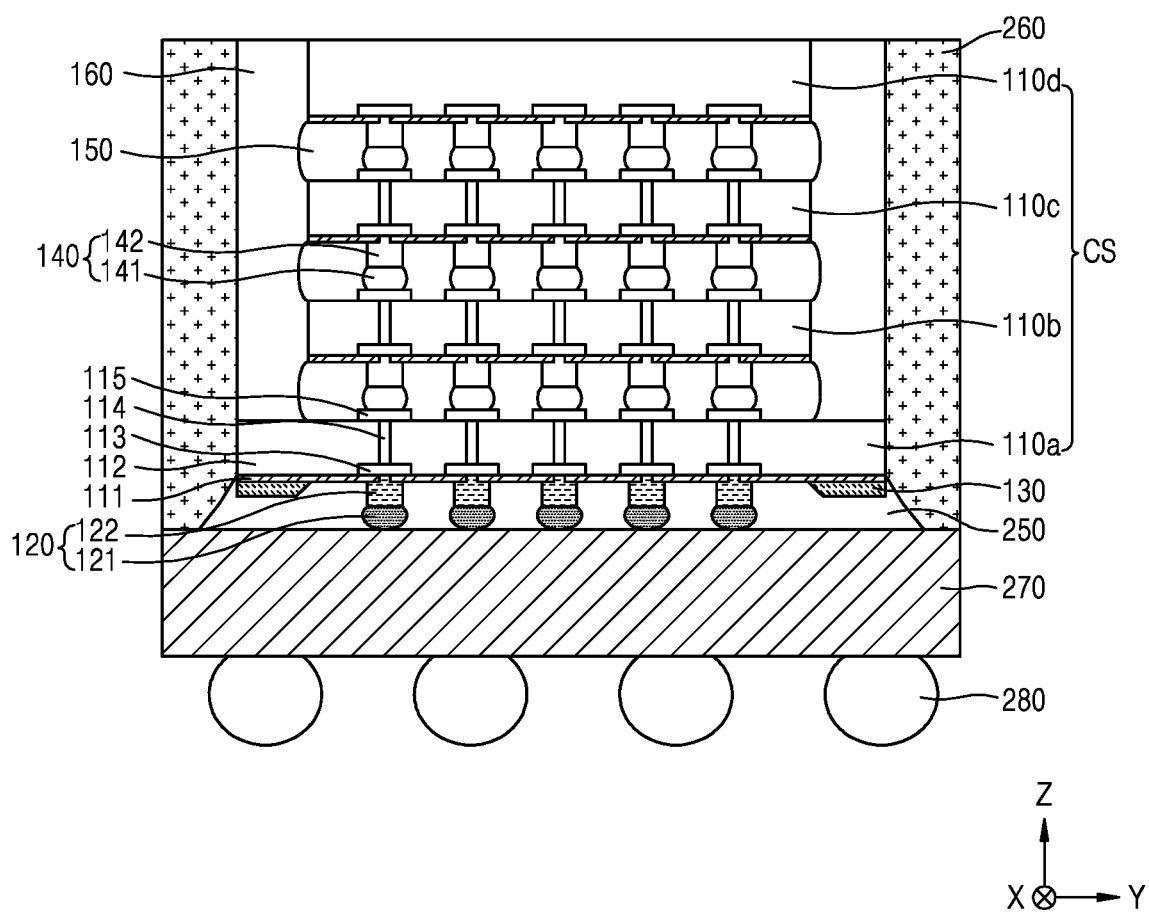
FIG. 4 is a cross-sectional view of a semiconductor package according to an embodiment.

FIG. 4 is a cross-sectional view of a semiconductor package 200 according to an embodiment. Hereinafter, differences from embodiments described with reference to FIGS. 1 through 3 will be described.

According to an embodiment, the semiconductor package 200 further includes a package substrate 270. The semiconductor chip stack CS that includes the first through fourth semiconductor chips 110a through 110d is mounted on the package substrate 270. The first semiconductor chip 110a and the package substrate 270 are connected to each other via the second connection bumps 120. The package substrate 270 is, for example, a printed circuit board (PCB) or an interposer substrate.

According to an embodiment, when the package substrate 270 is a PCB, the package substrate 270 includes a substrate body, and a substrate top pad and a substrate bottom pad that are respectively disposed on a top side and a bottom side of the substrate body. The substrate top pad is in contact with the second connection bump 120. The substrate body includes an internal wiring structure that electrically connects the substrate top pad to the substrate bottom pad. The substrate bottom pad contacts an external connection terminal 280.

According to an embodiment, the external connection terminal 280 is attached to the bottom surface of the package substrate 270. The external connection terminal 280 is electrically connected to the second connection bump 120 via the substrate bottom pad, the internal wiring structure, and the substrate top pad. The external connection terminal 280 includes, for example, a solder bump. The external connection terminal 280 electrically connects the semiconductor package 200 to an external device.

In some embodiments, a first under-fill unit 250 is disposed between the bottom surface of the first semiconductor chip 110a and the package substrate 270. The first under-fill unit 250 fills a space between the first semiconductor chip 110a and the package substrate 270. The first under-fill unit 250 protects the second connection bumps 120 from chemical and physical environments. The first under-fill unit 250 includes, for example, an epoxy resin or a silicone resin.

According to an embodiment, a package sealant 260 surrounds side surfaces of the chip sealant 160 and covers a top surface of the package substrate 270. The package sealant 260 includes, for example, an epoxy resin or a silicone resin.

According to an embodiment, the protection layer 130 protects the exposed bottom surface of the first semiconductor chip 110a before the semiconductor chip stack CS, after having been manufactured, is mounted on the package substrate 270. Thus, damage that occurs to the first semiconductor chip 110a between manufacturing the semiconductor chip stack CS and mounting the semiconductor chip stack CS on the package substrate 270 can be prevented.

Figure 5:
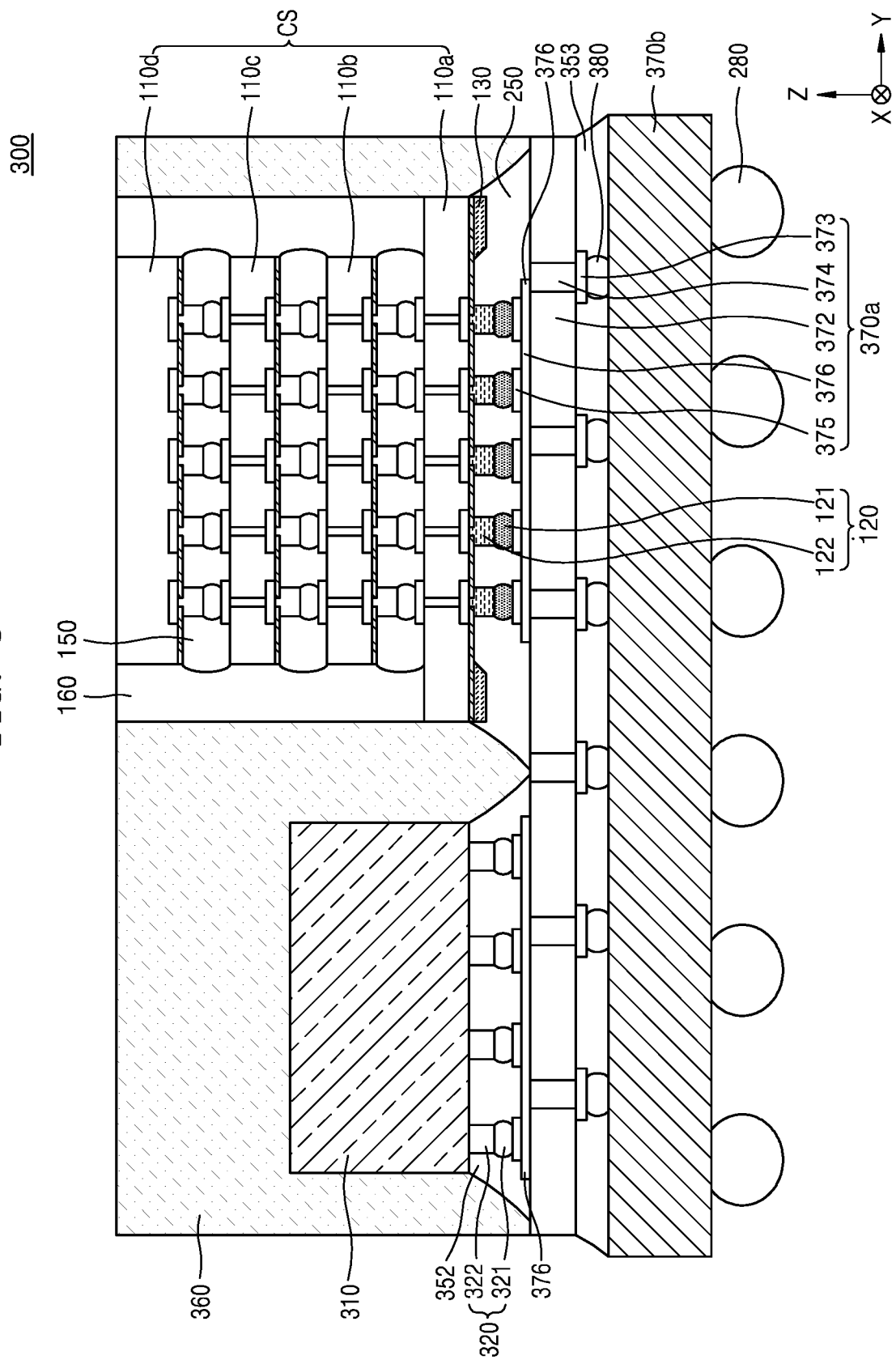
FIG. 5 is a cross-sectional view of a semiconductor package according to an embodiment.

FIG. 5 is a cross-sectional view of a semiconductor package 300 according to an embodiment. Hereinafter, differences from embodiments described with reference to FIG. 4 will be described.

Referring to FIG. 5, according to an embodiment, the semiconductor chip stack CS that includes the first through fourth semiconductor chips 110a through 110d and a fifth semiconductor chip 310 is mounted on the top package substrate 370a. The fifth semiconductor chip 310 is disposed on the side of the semiconductor chip stack CS rather than on the semiconductor chip stack CS. The fifth semiconductor chip 310 may be a logic semiconductor chip or a memory semiconductor chip. For example, the fifth semiconductor chip 310 may be a CPU, a GPU, or an AP.

According to an embodiment, a plurality of third connection bumps 320 are disposed between the fifth semiconductor chip 310 and the top package substrate 370a. The fifth semiconductor chip 310 is connected to the top package substrate 370a via third connection bumps 320. The third connection bumps 320 include a third pillar 322 and a third cap 321. In some embodiments, the third connection bumps 320 are similar to the second connection bumps 120.

In some embodiments, a space between the fifth semiconductor chip 310 and the top package substrate 370a is filled by a second under-fill unit 352. The second under-fill unit 352 includes, for example, an epoxy resin or a silicone resin.

According to an embodiment, the top package substrate 370a is, for example, the interposer substrate. The top package substrate 370a may include a semiconductor, glass, ceramic, or plastic. For example, the top package substrate 370a includes silicon. The top package substrate 370a includes a substrate body 372, a substrate top pad 375, a substrate bottom pad 373, a substrate through via 374, and a substrate wiring layer 376. The substrate top pad 375 is disposed on a top surface of the substrate body 372 and contacts the second connection bump 120 and the third connection bump 320. The substrate bottom pad 373 is disposed on a bottom surface of the substrate body 372. The substrate top pad 375 and the substrate bottom pad 373 are electrically connected to each other through via 374 in the substrate body 372. The substrate wiring layer 376 is disposed between the substrate top pad 375 and the substrate body 372 and via 374 or between the substrate bottom pad 373 and the substrate body 372 and via 374, and the substrate top pad 375 and the substrate bottom pad 373 are connected to each other through the substrate body 372 through via 374 and the substrate wiring layer 376.

According to an embodiment, the top package substrate 370a is mounted on a bottom package substrate 370b via an internal connection terminal 380 disposed under the top package substrate 370a. The internal connection terminal 380 includes, for example, a solder bump. In some embodiments, a space between the top package substrate 370a and the bottom package substrate 370b is filled by a third under-fill unit 353. The third under-fill unit 353 may include, for example, an epoxy resin or a silicone resin. The bottom package substrate 370b is, for example, a PCB, and the external connection terminal 280 can be disposed under the bottom package substrate 370b.

The semiconductor package 300 according to one embodiment is, for example, a system-in-package (SIP), but embodiments are not limited thereto.

FIGS. 6A through 6I are cross-sectional views that illustrate a method of manufacturing a semiconductor package according to an embodiment.

Figure 6A:
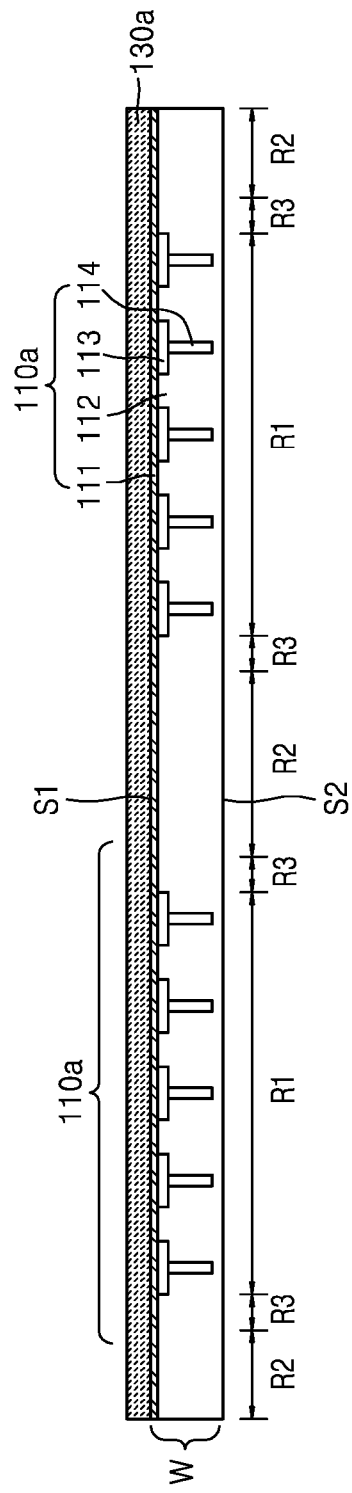

Referring to FIG. 6A, according to an embodiment, a semiconductor wafer W is prepared. The semiconductor wafer W has a first surface S1 and a second surface S2. In addition, the semiconductor wafer W includes a plurality of first regions R1, a plurality of second regions R2, and a plurality of third regions R3, which are horizontally arranged. A plurality of first semiconductor chips 110a are formed in the semiconductor wafer W. Each of the first semiconductor chips 110a includes the passivation layer 111, the body 112, the bottom pad 113, and the through via 114. The body 112 and the through via 114 are formed in the first regions R1 of the semiconductor wafer W, and the bottom pad 113 is formed on a first surface S1 of the semiconductor wafer W in the first regions R1. The passivation layer 111 is formed on the first surface S1 of the semiconductor wafer W to cover the bottom pad 113. The passivation layer ill is formed over the first regions R1, the second regions R2, and the third regions R3 of the semiconductor wafer W. The passivation layer 111 can be formed by, for example, chemical vapor deposition (CVD), physical vapor deposition (PVD), or atomic layer deposition (ALD).

Next, according to an embodiment, a protective material layer 130a is formed on the passivation layer 111. The protective material layer 130a includes a photosensitive material such as a photosensitive polyimide. The protective material layer 130a is formed by spin coating. The protective material layer 130a is formed over the first regions R1, the second regions R2, and the third regions R3 of the semiconductor wafer W.

Figure 6B:
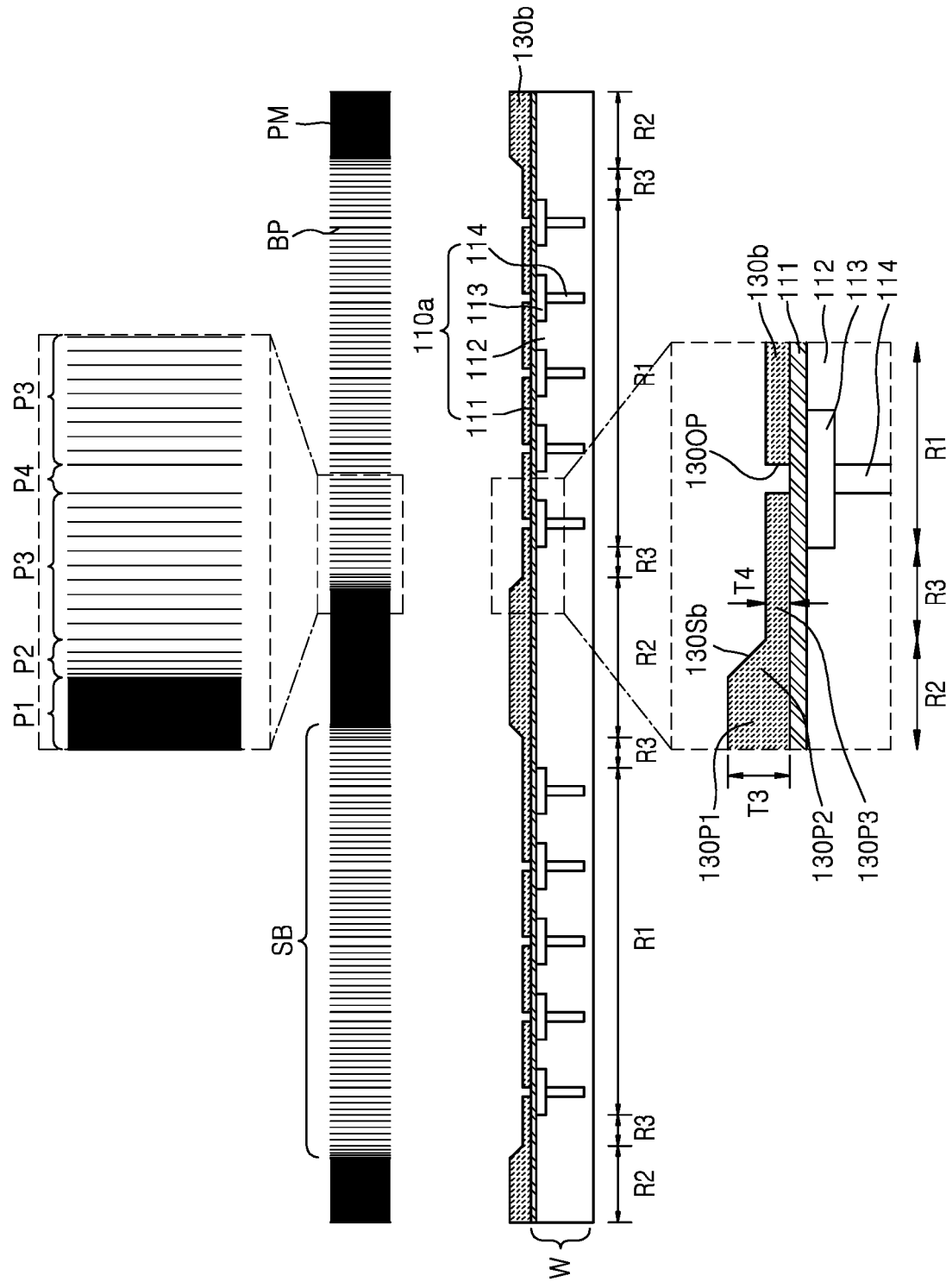

Referring to FIGS. 6A and 6B, according to an embodiment, the protective material layer 130a is patterned to form a preliminary protection pattern 130b. The preliminary protection pattern 130b includes a first portion 130P1 having a third thickness T3, a second portion 130P2 having an inclined side wall 130Sb, a third portion 130P3 having a fourth thickness T4, and a preliminary opening 130OP. Here, the third thickness T3 is greater than the fourth thickness T4. The preliminary opening 130OP of the preliminary protection pattern 130b is formed over the bottom pad 113. The third portion 130P3 of the preliminary protection pattern 130b is formed around the preliminary opening 130OP. The first portion 130OP1 of the preliminary protection pattern 130b is formed around the third portion 130OP3 of the preliminary protection pattern 130b. The second portion 130P2 of the preliminary protection pattern 130b is disposed between the first portion 130P1 and the third portion 130P3 of the preliminary protection pattern 130b. A thickness of the second portion 130P2 increases toward the first portion 130P1, and decreases toward the third portion 130P3.

According to an embodiment, photolithography is used to form the preliminary protection pattern 130b having such a three-dimensional shape. A photomask PM used to form the preliminary protection pattern 130b includes a scattering bar SB. The scattering bars SB include bar patterns BP spaced apart from each other. The transmittance of the photomask PM, that is, the intensity of light transmitted through the photomask PM, is adjusted by controlling a width of the bar pattern BP or an interval between the bar patterns in the scattering bar SB.

According to an embodiment, the photomask PM includes first through fourth portions P1 through P4. The first portion P1 of the photomask PM is covered with a pattern so that no light incident on the photomask PM is transmitted. The fourth portion P4 of the photomask PM is not covered with a pattern so that most of the light incident on the photomask PM is transmitted. The third portion P3 of the photomask PM includes a plurality of bar patterns BP having a predetermined width and spaced apart by a predetermined intervals. The light transmittance of the third portion P3 of the photomask PM is between that of the first portion P of the photomask PM and the fourth portion P4 of the photomask PM. The second portion P2 of the photomask PM includes a plurality of bar patterns BP whose widths or intervals therebetween are not constant. For example, the interval between adjacent bar patterns BP of the second portion P2 of the photomask PM decrease toward the first portion P1 of the photomask PM, and increase toward the third portion P3 of the photomask PM. The transmittance of the second portion P2 of the photomask PM varies depending on a position. The transmittance of the second portion P2 of the photomask PM decreases toward the first portion P1 and increase toward the third portion P3.

According to an embodiment, a thickness of each of the first through fourth portions 130P1 through 130P3 of the preliminary protection pattern 130b is adjusted by controlling the transmittance of light transmitted through each of the first through fourth portions P1 through P4 of the photomask PM. The first portion P1 of the photomask PM that has a low light transmittance forms the first portion 130P1 of the preliminary protection pattern 130b that has the third thickness T3. The fourth portion P4 of the photomask PM that has a high light transmittance forms the preliminary opening 130OP of the preliminary protection pattern 130b. The third portion P3 of the photomask PM that has a transmittance between the transmittance of the first portion P1 and the transmittance of the fourth portion P4 forms the third portion 130P3 of the preliminary protection pattern 130b that has the fourth thickness T4. The second portion P2 of the photomask PM, whose light transmittance varies depending on position, form the second portion 130P2 of the preliminary protection pattern 130b, whose thickness varies depending on position.

In this embodiment, since the protective material layer 130a includes a photosensitive material such as PSPI, a separate photoresist layer is not necessary. However, in other embodiments in which the protective material layer 130a does not include a photosensitive material, additional steps of forming a photoresist layer, forming a photoresist pattern, and forming the preliminary protective pattern 130b by patterning the protective material layer 130a using a photoresist mask are performed.

Figure 6C:
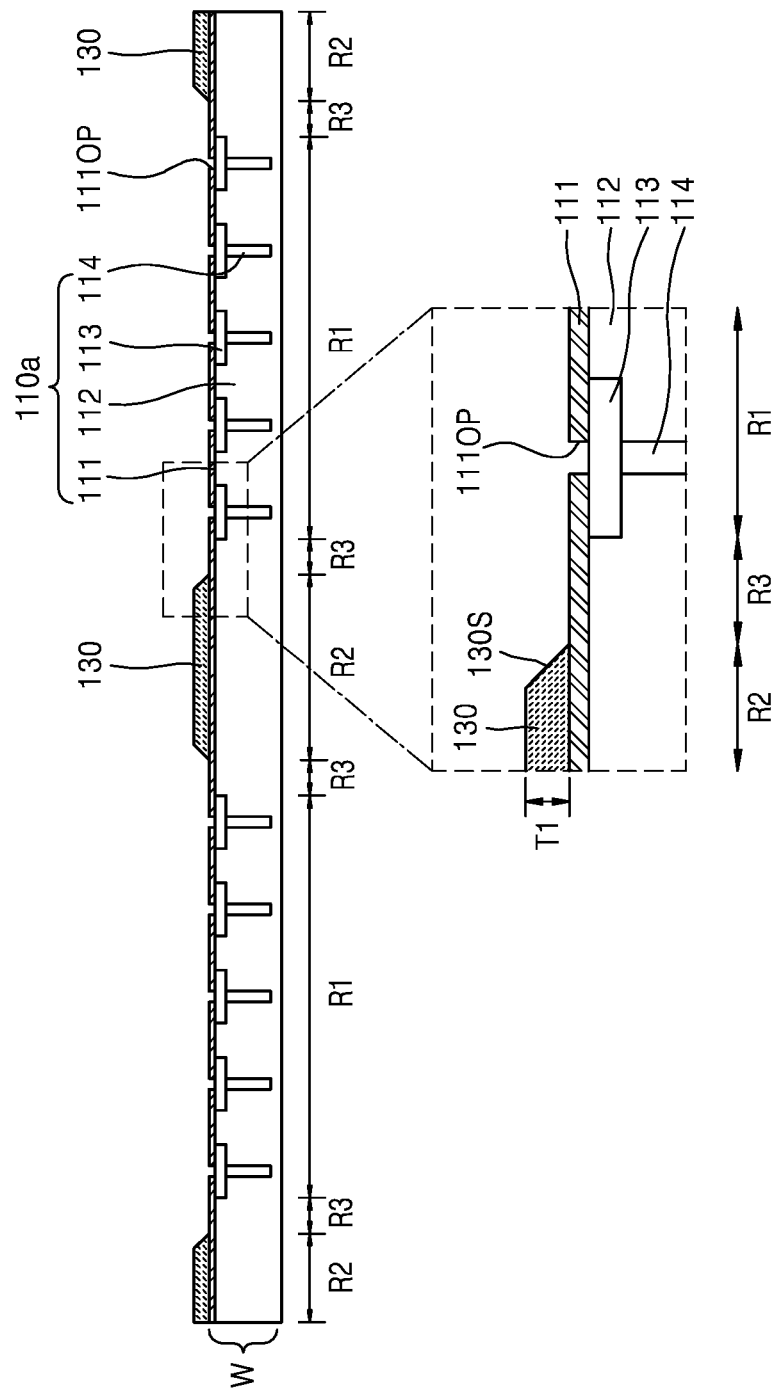

Referring to FIGS. 6B and 6C, according to an embodiment, the protection layer 130 is formed by etching the preliminary protection pattern 130b. The etching is performed until all the third portions 130P3 of the preliminary protection pattern 130b are removed, and is stopped before all first portions 130P1 of the preliminary protection pattern 130b are removed. As a result, the protection layer 130 remains only on the second region R2 of the semiconductor wafer W, and the passivation layer 111 is exposed on the first region R1 and the third region R3 of the semiconductor wafer W. In addition, the openings 111OP are formed in the passivation layer 111 on the first region R1 of the semiconductor wafer W, and portions of the bottom pads 113 are exposed. The thickness T1 of the protection layer 130 on the second region R2 of the semiconductor wafer W is less than the third thickness T3 of the first portion 130P1 of the preliminary protection pattern 130b before the etching. The etched protection layer 130 has the inclined side wall 130S.

Figure 6D:
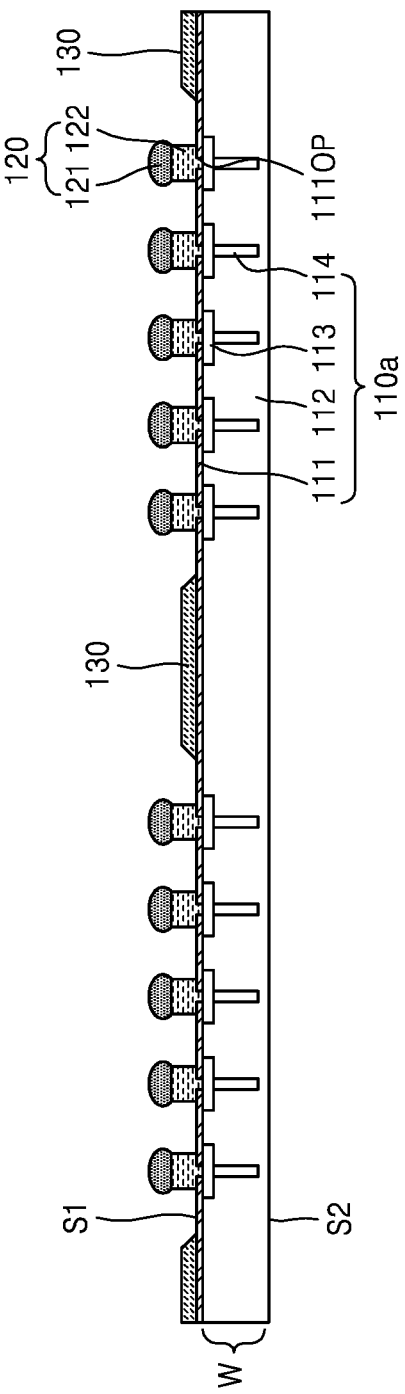

Referring to FIG. 6D, according to an embodiment, the second connection bumps 120 are formed in the openings 111OP of the passivation layer 111. For example, the second pillars 122 and the second caps 121 are formed by forming a photoresist pattern on the semiconductor wafer W, forming a material layer of the second pillar 122 and a material layer of the second cap 121 by plating or sputtering, removing the photoresist pattern, and reflowing.

Figure 6E:
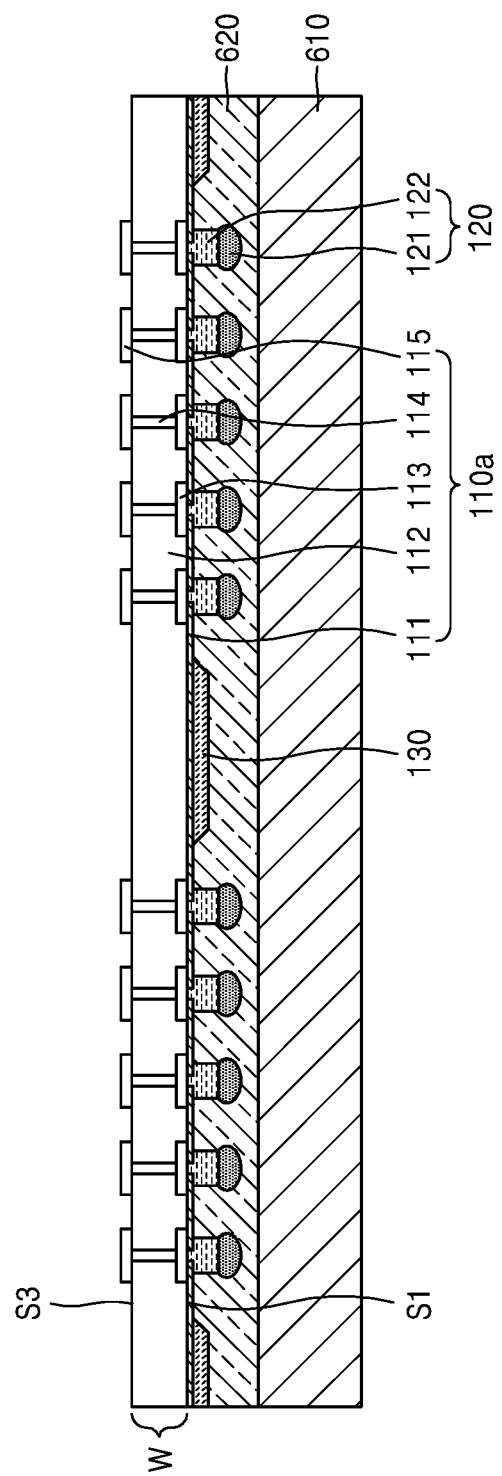

Referring to FIG. 6E, according to an embodiment, the semiconductor wafer W is attached to the carrier 610 using the carrier bonding layer 620. The semiconductor wafer W is attached to the carrier 610 such that the second connection bumps 120 and the first surface S1 of the semiconductor wafer W face the carrier 610. In this case, the second connection bumps 120 and the protection layer 130 are in contact with the carrier bonding layer 620, and the carrier bonding layer 620 fills a space between the second connection bumps 120 and a space between the second connection bumps 120 and the protection layer 130.

Next, according to an embodiment, a portion of the semiconductor wafer W is removed to expose the through vias 114. A third surface S3 of the semiconductor wafer W that faces the first surface S of the semiconductor wafer W is formed by removing portions from the second surface S2 of the semiconductor wafer W until one end of the through via 114 is exposed through the third surface S3 of the semiconductor wafer W. A chemical mechanical polish (CMP) process or an etch-back process can be performed to remove portions from the second surface S2 of the semiconductor wafer W to form the third surface S3 of the semiconductor wafer W.

Next, according to an embodiment, the top pads 115 are formed on the third surface S3 of the semiconductor wafer W and electrically connected to the through vias 114.

Figure 6F:
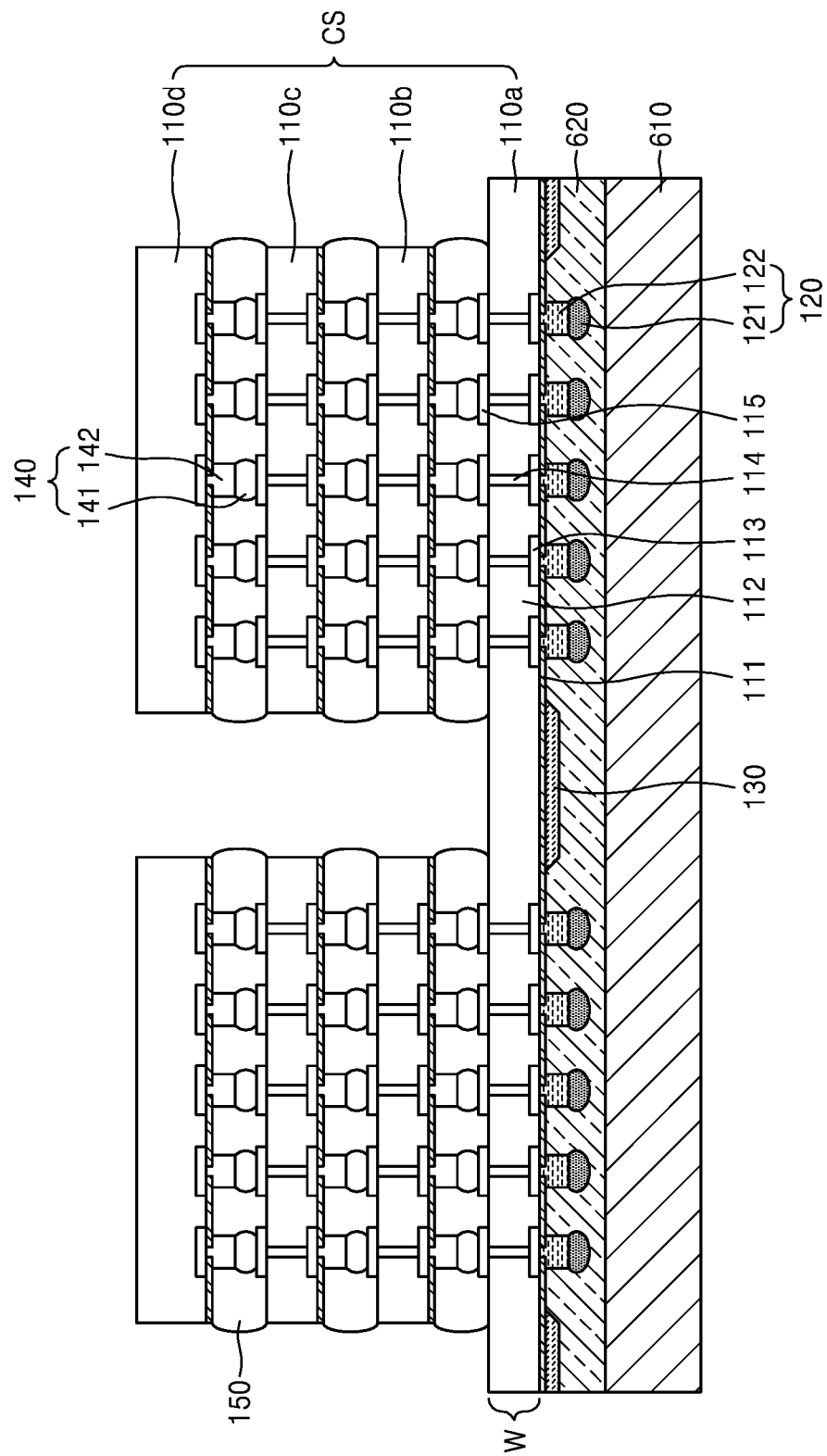

Referring to FIG. 6F, according to an embodiment, the second, third, and fourth semiconductor chips 110b, 110c, and 110d are attached to the semiconductor wafer W. For example, the second through fourth semiconductor chips 110b through 110d are sequentially stacked on the first semiconductor chip 110a to form one semiconductor chip stack CS. A plurality of semiconductor chip stacks CS can be formed on one semiconductor wafer W. The chip bonding layer 150 is formed between successive first through fourth semiconductor chips 110a through 110d to bond them to each other.

Figure 6G:
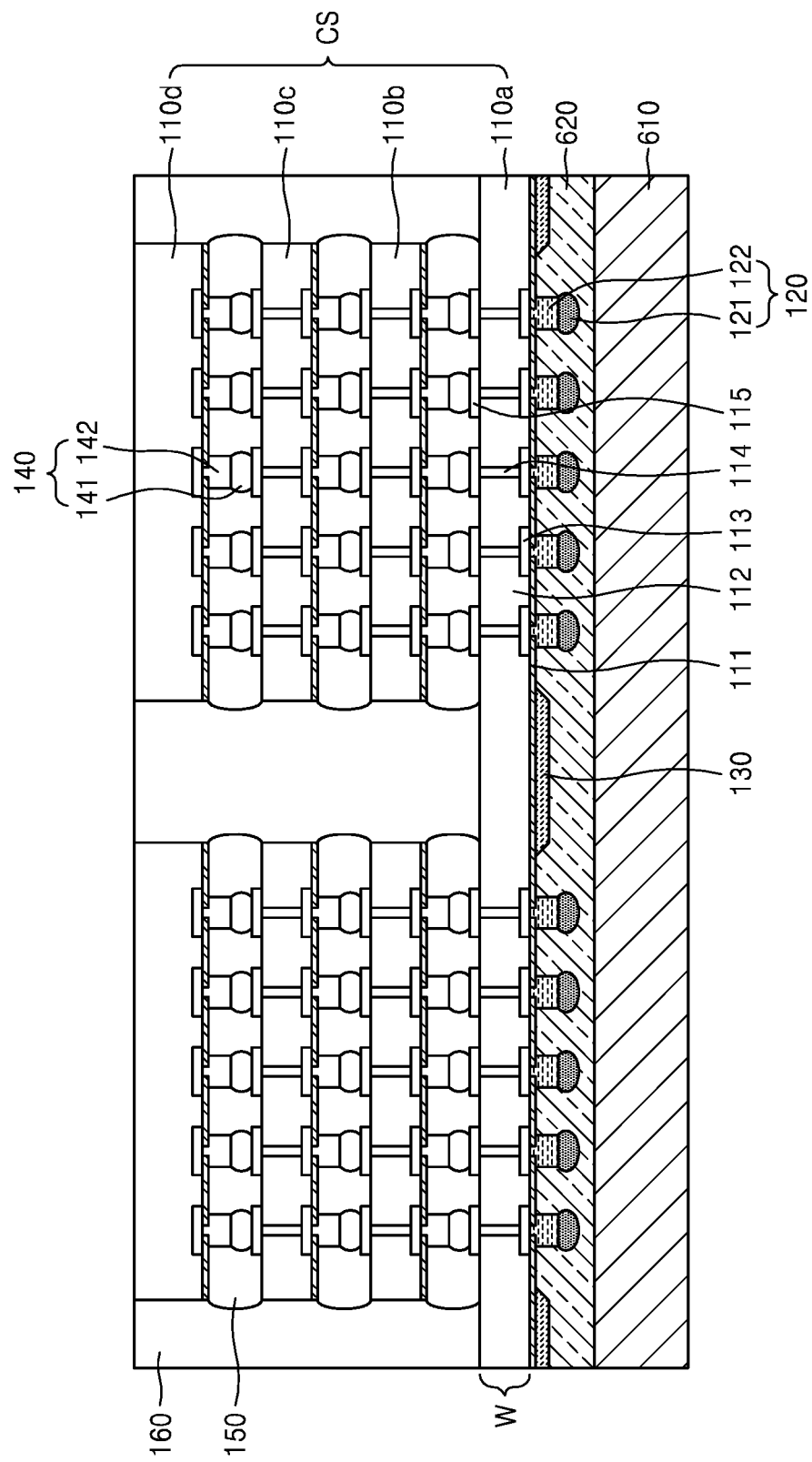

Referring to FIG. 6G, according to an embodiment, the chip sealant 160 is formed on the top surface of the first semiconductor chip 110a. The chip sealant 160 covers side surfaces of the second through fourth semiconductor chips 110b through 110d and the top surface of the first semiconductor chip 110d. In some embodiments, a portion of the chip sealant 160 is removed so that the top surface of the fourth semiconductor chip 110d at the uppermost end of the semiconductor chip stack CS is exposed. A process, such as chemical mechanical polishing can be used to expose the top surface of the fourth semiconductor chip 110d.

Referring to FIG. 6H, according to an embodiment, the carrier 610 and the carrier bonding layer 620 are removed from the semiconductor wafer W. Since the protection layer 130 is formed apart from the second connection bumps 120 and the protection layer 130 is not formed between the second connection bumps 120, there is a sufficient space between the second connection bumps 120 and the protection layer 130. Thus, portions of the carrier bonding layer 620 are prevented from remaining in the space between the second connection bumps 120 and the protection layer 130.

Figure 6I:
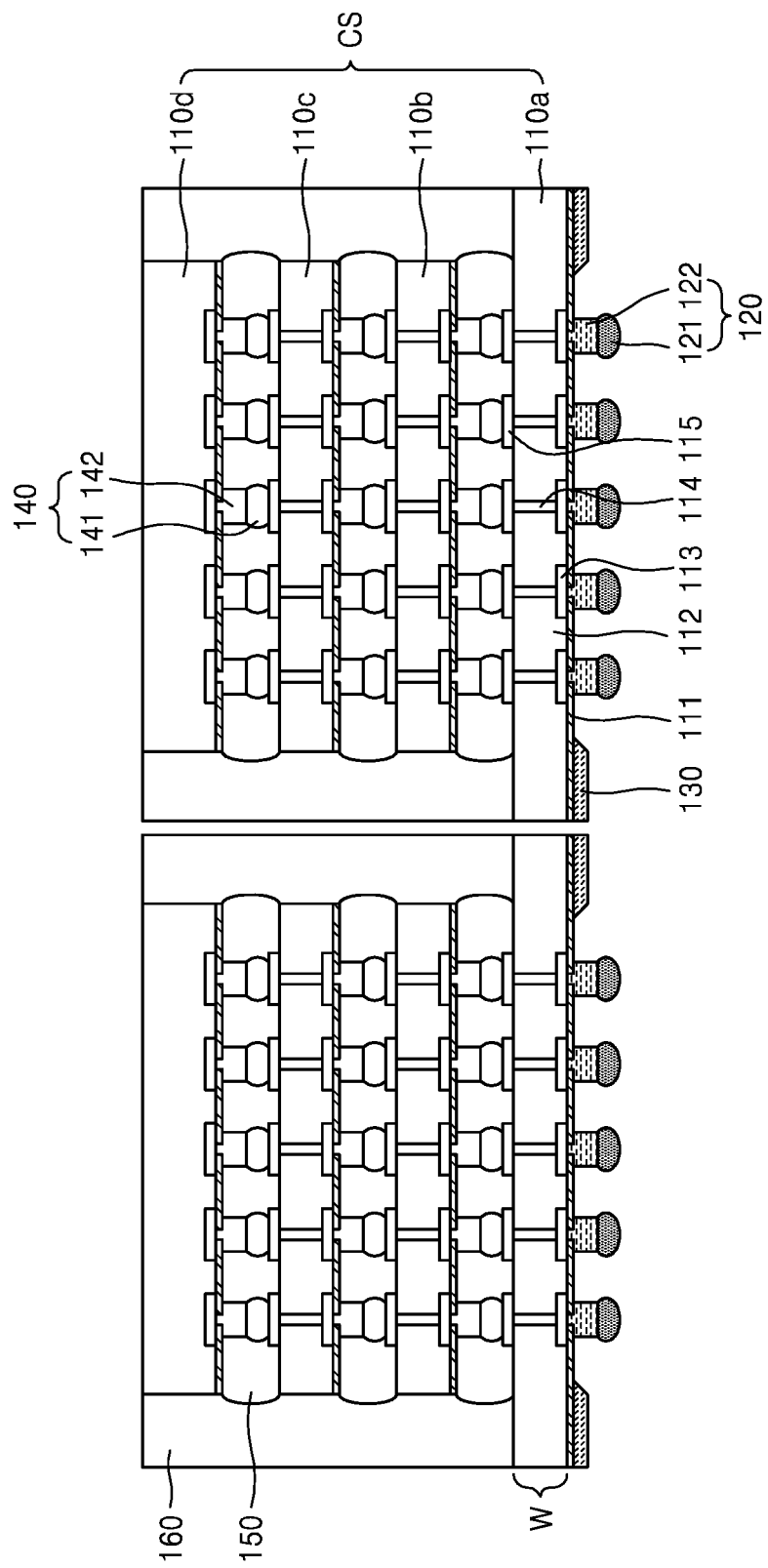

Referring to FIG. 6I, according to an embodiment, the semiconductor chip stacks CS are separated from each other by a cutting process. For example, a saw cutting or a laser cutting can be used to cut spaces between the semiconductor chip stacks CS. An adhesive tape is attached to the top ends of the semiconductor chip stacks CS before the cutting process. The adhesive tape is removed from the semiconductor chip stacks CS after the cutting is completed. In a manner described above, the semiconductor package 100 according to a embodiment described with reference to FIGS. 1 through 3 may be manufactured.

Figure 7A:
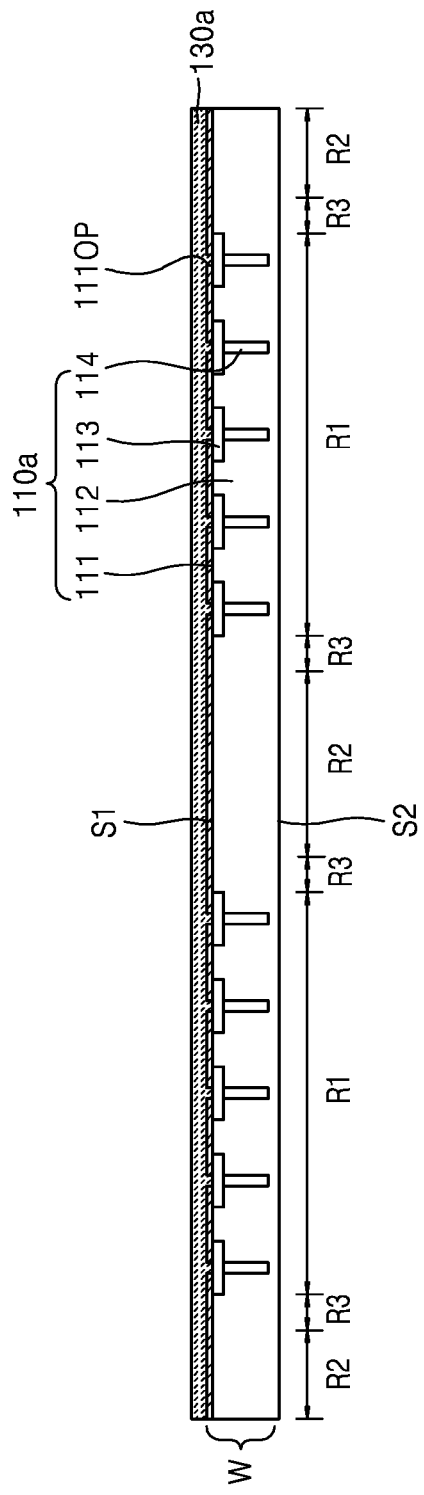

FIGS. 7A and 7B are cross-sectional views that illustrate a method of manufacturing a semiconductor package according to an embodiment. Hereinafter, differences between a semiconductor package manufacturing method described with reference to FIGS. 6A through 6I and a present embodiment will be described.

Referring to FIG. 7A, according to an embodiment, a plurality of first semiconductor chips 110a are formed on the semiconductor wafer W. Next, the openings 111OP are formed in the passivation layer 111 before the protective material layer 130a is formed. For example, to form the openings 111OP in the passivation layer 111, a photoresist pattern is formed on the passivation layer 111, portions of the passivation layer 111 exposed by the photoresist pattern are etched, and the photoresist pattern is removed. Then, the protective material layer 130a is formed on the passivation layer 111.

Referring to FIGS. 7A and 7B, according to an embodiment, the protection layer 130 is formed by patterning the protective material layer 130a. The protective layer 130 is formed directly from the protective material layer 130a without forming the preliminary protective pattern 130b illustrated in FIG. 6B. The photolithography photomask PM includes the first portion P1, the second portion P2, and the fourth portion P4. In other words, the photomask PM used in a manufacturing method according to a present embodiment does not include the third portion P3 of the photomask PM illustrated in FIG. 6B.

According to an embodiment, the first portion P1 of the photomask PM form a portion with the first thickness T1 of the protection layer 130. The second portion P2 of the photomask PM form a portion with the inclined side wall 130S of the protection layer 130. The fourth portion P4 of the photomask PM allows the protection layer 130 to be removed from the first region R1 and the third region R3 of the semiconductor wafer W.

Thereafter, according to an embodiment, the semiconductor package 100 according to an embodiment illustrated in FIGS. 1 through 3 can be manufactured by performing processes illustrated in FIGS. 6D through 6I.

Exemplary embodiments of the inventive concept herein disclosed are intended to describe the scope of the embodiments of the inventive concept. The scope of protection of the embodiments of the inventive concept should not be limited by the embodiments and should be construed according to the following claims, and all technical ideas which are within the scope of the same should be interpreted as being included in the scope of embodiments of the inventive concept.

What is claimed is:

1. A semiconductor package comprising:
    a semiconductor chip comprising a first region and a second region spaced apart from the first region;
    a plurality of connection bumps disposed under the first region of the semiconductor chip; and
    a protection layer that continuously covers a bottom surface of the semiconductor chip in the entire second region,
    wherein the protection layer does not cover the bottom surface of the semiconductor chip in the first region and is not disposed between the plurality of connection bumps,
    wherein the semiconductor chip comprises a passivation layer, and the protection layer is located on a bottom surface of a portion of the passivation layer in the second region of the semiconductor chip,
    wherein a toughness of the protection layer is greater than a toughness of the passivation layer, and
    wherein the passivation layer comprises an inorganic material and the protection layer comprises an organic material.

2. The semiconductor package of claim 1, wherein the semiconductor chip further comprises a third region between the first region and the second region, none of the plurality of connection bumps are disposed under the third region of the semiconductor chip, and the protection layer does not to cover the third region of the semiconductor chip.

3. The semiconductor package of claim 2, wherein the third region of the semiconductor chip surrounds the first region of the semiconductor chip, and the second region of the semiconductor chip surrounds the third region of the semiconductor chip.

4. The semiconductor package of claim 1, wherein the first region of the semiconductor chip is positioned at a center portion of the semiconductor chip and the second region of the semiconductor chip is positioned at an edge portion of the semiconductor chip.

5. A semiconductor package comprising:
    a semiconductor chip stack that includes a plurality of semiconductor chips stacked in a vertical direction;
    a connection bump disposed under a center portion of a lowermost semiconductor chip of the plurality of semiconductor chips, wherein the connection bump comprises a pillar that contacts the lowermost semiconductor chip and a cap that covers a bottom surface of the pillar; and
    a protection layer disposed under an edge portion of the lowermost semiconductor chip,
    wherein the protection layer is spaced apart from the connection bump in a horizontal direction,
    wherein the lowermost semiconductor chip comprises a passivation layer, and the protection layer is located on a bottom surface of a portion of the passivation layer in the edge portion of the semiconductor chip,
    wherein a toughness of the protection layer is greater than a toughness of the passivation layer, and
    wherein a side wall of the protection layer that faces the connection bump is inclined with respect to the vertical direction away from the connection bump.

6. The semiconductor package of claim 5, wherein a separation distance between the connection bump and the protection layer in the horizontal direction is greater than a height of the connection bump in the vertical direction.

7. The semiconductor package of claim 5, wherein a separation distance between the connection bump and the protection layer in the horizontal direction is greater than a height of the pillar in the vertical direction.

8. The semiconductor package of claim 5, wherein a separation distance between the connection bump and the protection layer in the horizontal direction is greater than a thickness of the protection layer in the vertical direction.

9. The semiconductor package of claim 5, wherein a thickness of the protection layer in the vertical direction is less than a height of the connection bump in the vertical direction.

10. The semiconductor package of claim 5, wherein a thickness of the protection layer in the vertical direction is less than a height of the pillar in the vertical direction.

11. The semiconductor package of claim 5, wherein a thickness of the protection layer in the vertical direction is greater than a thickness of the passivation layer in the vertical direction.

12. A semiconductor package comprising:
    a package substrate;
    a first semiconductor chip mounted on the package substrate, wherein the first semiconductor chip comprises a passivation layer on a bottom surface of the first semiconductor chip;
    a second semiconductor chip mounted on the first semiconductor chip;
    a plurality of connection bumps disposed under a bottom surface of a center portion of the first semiconductor chip that connect the first semiconductor chip to the package substrate; and
    a protection layer that covers a portion of the passivation layer under a bottom surface of an edge portion of the first semiconductor chip but not under the center portion of the first semiconductor chip,
    wherein the protection layer is spaced apart from the package substrate, and
    wherein the passivation layer comprises an inorganic material and the protection layer comprises an organic material.

13. The semiconductor package of claim 12, wherein the protection layer is spaced apart from the plurality of connection bumps.

14. The semiconductor package of claim 12, wherein the protection layer is not disposed between the plurality of connection bumps.

15. The semiconductor package of claim 12, wherein a toughness of the protection layer is greater than a toughness of the passivation layer.

\* \* \* \* \*